United States Patent
Datta et al.

(10) Patent No.: US 6,853,076 B2
(45) Date of Patent: Feb. 8, 2005

(54) COPPER-CONTAINING C4 BALL-LIMITING METALLURGY STACK FOR ENHANCED RELIABILITY OF PACKAGED STRUCTURES AND METHOD OF MAKING SAME

(75) Inventors: Madhav Datta, Portland, OR (US); Dave Emory, Aloha, OR (US); Subhash M. Joshi, Beaverton, OR (US); Susanne Menezes, Portland, OR (US); Doowon Suh, Warren, OR (US)

(73) Assignee: Intel Corporation, Santa Clara, CA (US)

(*) Notice: Subject to any disclaimer, the term of this patent is extended or adjusted under 35 U.S.C. 154(b) by 114 days.

(21) Appl. No.: 09/961,034

(22) Filed: Sep. 21, 2001

(65) Prior Publication Data

US 2003/0057551 A1 Mar. 27, 2003

(51) Int. Cl.[7] .................. H01L 23/48; H01L 23/52; H01L 29/40
(52) U.S. Cl. .................. 257/738; 438/737; 438/750; 438/753
(58) Field of Search .................. 438/737, 738, 438/750, 753

(56) References Cited

U.S. PATENT DOCUMENTS

| | | | |
|---|---|---|---|
| 3,663,184 A | 5/1972 | Wood et al. .................. 29/195 |
| 4,290,079 A | 9/1981 | Carpenter et al. ............ 357/71 |
| 4,360,142 A | 11/1982 | Carpenter et al. .......... 228/123 |
| 4,505,029 A | 3/1985 | Owyang et al. .............. 29/589 |
| 5,648,686 A | 7/1997 | Hirano et al. ................ 257/778 |
| 5,736,456 A | 4/1998 | Akram ........................ 438/614 |
| 5,773,359 A | 6/1998 | Mitchell et al. ............ 438/614 |
| 5,885,891 A | 3/1999 | Miyata et al. .............. 438/612 |
| 6,111,321 A | 8/2000 | Agarwala .................... 257/772 |
| 6,222,279 B1 | 4/2001 | Mis et al. .................... 257/779 |
| 6,224,690 B1 | 5/2001 | Andricacos et al. ........ 148/400 |
| 6,232,212 B1 | 5/2001 | Degani et al. .............. 438/612 |
| 6,348,730 B1 | 2/2002 | Yi et al. ...................... 257/737 |
| 6,426,282 B1 | 7/2002 | Saigal et al. ................ 438/613 |
| 6,489,229 B1 | 12/2002 | Larsen et al. ............... 438/614 |

FOREIGN PATENT DOCUMENTS

JP 2001189334 7/2001 ........... H01L/21/60

OTHER PUBLICATIONS

"Chromium Copper Step Phasing", *IBM Technical Disclosure Bulletin*, (Aug. 1, 1977), pp. 1005–1006.

Tummala, Rao, et al., "Microelectronics Packaging Handbook, Semiconductor Packaging", Part 2, 2nd Edition, (1997), pp. 132–139.

*Primary Examiner*—Long Pham
(74) *Attorney, Agent, or Firm*—Blakely, Sokoloff, Taylor & Zafman LLP

(57) ABSTRACT

The invention relates to a ball-limiting metallurgy stack for an electrical device that contains at least one copper layer disposed upon a Ti adhesion metal layer. The ball-limiting metallurgy stack resists Sn migration toward the upper metallization of the device.

7 Claims, 9 Drawing Sheets

COPPER-CONTAINING C4 BALL-LIMITING METALLURGY STACK FOR ENHANCED RELIABILITY OF PACKAGED STRUCTURES AND METHOD OF MAKING SAME

BACKGROUND OF THE INVENTION

1. Field of the Invention

An embodiment of the present invention relates generally to integrated circuit fabrication. More particularly, an embodiment of the present invention relates to electrical connection technology. In particular, an embodiment of the present invention relates to a ball-limiting metallurgy comprising a copper layer.

2. Description of Related Art

Electrical bump connectors such as metal bumps or balls are used in flip-chip applications that may include controlled collapse (C4) flip-chip applications. As the progress of miniaturization continues, the junction between a microelectronic device metallization and the electrical bump becomes increasingly large relative to the mass of the electrical bump. Consequently, junction disparities have an increasingly detrimental effect on electrical communication between the device and the electrical bump. One junction disparity relates to migration of the flip-chip tin, typically from Sn37Pb solder, toward the metallization. Another consequence of miniaturization is stress that builds up in the ball-limiting metallurgy due to the formation of tin-containing intermetallic structures between the metallization and the electrical bump.

BRIEF DESCRIPTION OF THE DRAWINGS

In order that the manner in which embodiments of the present invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

An embodiment of the present invention relates to a ball-limiting metallurgy (BLM) stack that facilitates miniaturization, that obviates the effects of tin migration from the flip-chip package into the metallization, and that resists electrical discontinuities between metallization and metal bumps. In one embodiment, a metal first layer is disposed above and on the metallization. A copper metal second layer is disposed above and on the metal first layer, and a metal third layer is disposed over the copper metal second layer. The metal third layer is preferably a non-ferroelectric metal alloy or doped metal. An electrically conductive bump is disposed above and on the metal third layer.

In another embodiment, a metal first layer is disposed above and on the metallization. A metal second layer is disposed above and on the metal first layer. The metal second layer is preferably a non-ferroelectric metal alloy or doped metal. A copper metal third layer is disposed over the metal second layer. An electrically conductive bump is disposed above and on the copper metal third layer.

In another embodiment, a metal first layer is disposed above and on the metallization. A copper metal second layer is disposed above and on the metal first layer. A copper stud is disposed over the metal second layer. An electrically conductive bump is disposed above and on the copper stud.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientations.

Reference will now be made to the drawings wherein like structures will be provided with like reference designations. In order to show the structures of embodiments of the present invention most clearly, the drawings included herein are diagrammatic representations of integrated circuit structures. Thus, the actual appearance of the fabricated structures, for example in a photomicrograph, may appear different while still incorporating the essential structures of embodiments of the present invention. Moreover, the drawings show only the structures necessary to understand embodiments of the present invention. Additional structures known in the art have not been included to maintain the clarity of the drawings.

Figure 1:
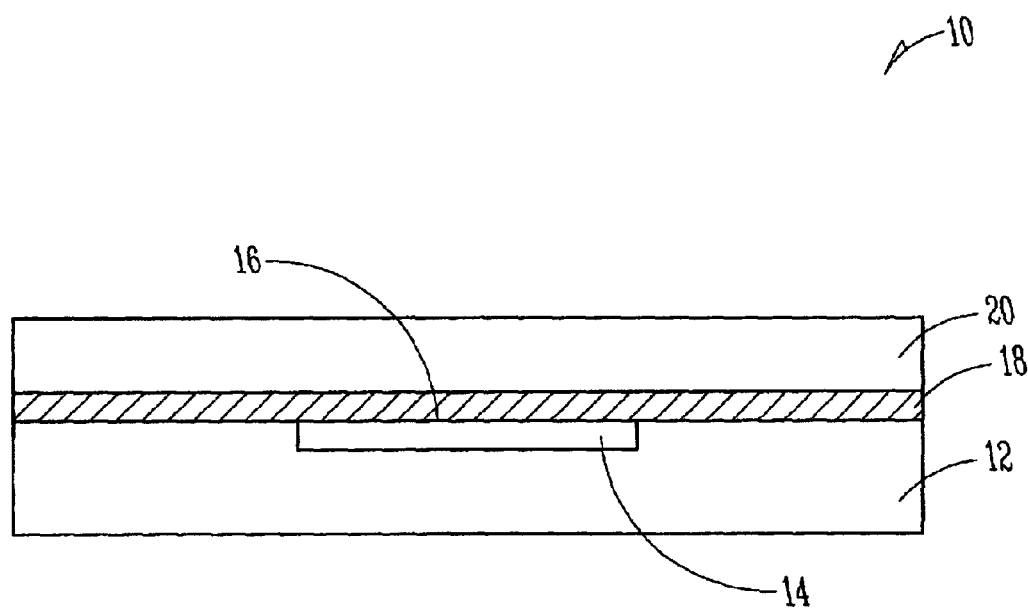
FIG. 1 is an elevational cross-section of a semiconductor structure that reveals metallization.

FIG. 1 is a cross-section of a semiconductor structure 10 during fabrication that includes a substrate 12 and a metallization 14 such as a copper pad that makes connection to what is commonly referred to as metal six (M6) by way of non-limiting example. Metallization 14 may be coplanar with an upper surface 16 of substrate 12 where substrate 12 may be an interlayer dielectric (ILD) composition. A nitride layer 18 is formed over substrate 12 and metallization 14. Additionally, a passivation layer 20 is formed over nitride layer 18. Passivation layer 20 and nitride layer 18 act to protect substrate 12 and to expose metallization 14 according to the patterning. Passivation layer 20 may be a polyimide material or it may be an inorganic material such as a silicon oxide that is formed by the decomposition of tetraethyl ortho silicate (TEOS). Patterning is accomplished by use of a first mask (not pictured) to form a recess 22 during an etch process.

Figure 2:
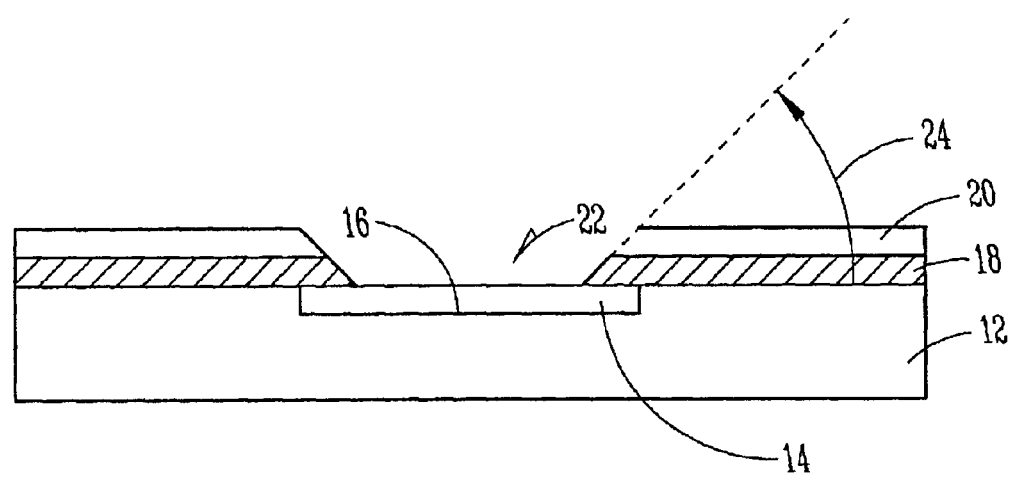
FIG. 2 is an elevational cross-section of the semiconductor structure depicted in FIG. 1 after patterning of a passivation layer.

FIG. 2 illustrates a patterned passivation structure, that includes portions of former nitride layer 18 and passivation layer 20, and that exposes a portion of metallization 14. The process may be carried out by blanket forming nitride layer 18 and passivation layer 20, patterning, etching recess 22, and curing passivation layer 20 where passivation layer 20 is a polyimide. After the cure, passivation layer 20 has formed a slope 24 that may have an angle, in a range from about 30° to about 60°, and preferably about 45°.

Figure 3:
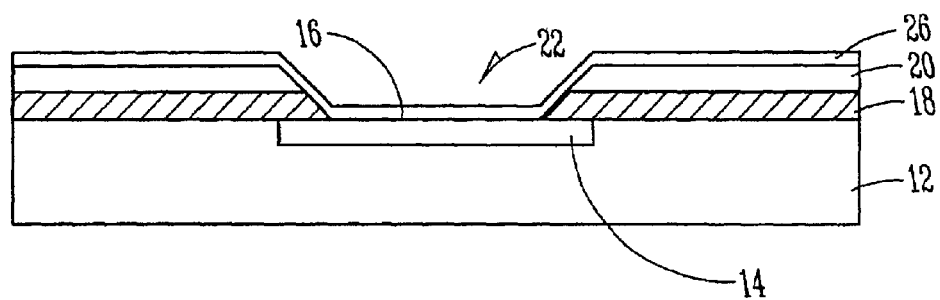
FIG. 3 is an elevational cross-section of the semiconductor structure depicted in FIG. 2 after further processing.

FIG. 3 illustrates further processing that is carried out where patterned passivation layer 20, patterned nitride layer 18, and metallization 14 are covered with a metal first layer 26. Metal first layer 26 may be a refractory metal such as titanium, zirconium, hafnium, and the like. Other refractory metals for metal first layer 26 may include nickel, cobalt, palladium, platinum, and the like. Other refractory metals for metal first layer 26 may include chromium, molybdenum, tungsten, and the like. Other refractory metals for metal first layer 26 may include scandium, yttrium, lanthanum, cerium, and the like. One preferred property embodiment may be a metal first layer 26 that exhibits sufficient adhesion to the metallization 14 that liftoff or spalling thereof will not occur during fabrication, test, and ordinary field use.

In a first general embodiment, metal first layer 26 is titanium (Ti) that is formed by physical vapor deposition (PVD) to a thickness in a range from about 500 Å to about 4,000 Å, and preferably about 2,000 Å. In another embodiment, metal first layer 26 is chromium (Cr) that is formed by PVD to a thickness in a range from about 500 Å to about 4,000 Å, and preferably about 2,000 Å. In another embodiment, metal first layer 26 is tungsten (W) that is formed by PVD to a thickness in a range from about 500 Å to about 4,000 Å, and preferably about 2,000 Å. In another embodiment, metal first layer 26 is titanium-tungsten (TiW) that is formed by PVD to a thickness in a range from about 500 Å to about 4,000 Å, and preferably about 2,000 Å. In each embodiment, metal first layer 26 is sputtered under conditions that put it under a compressive stress. Such sputtering conditions are known in the art.

Figure 4:
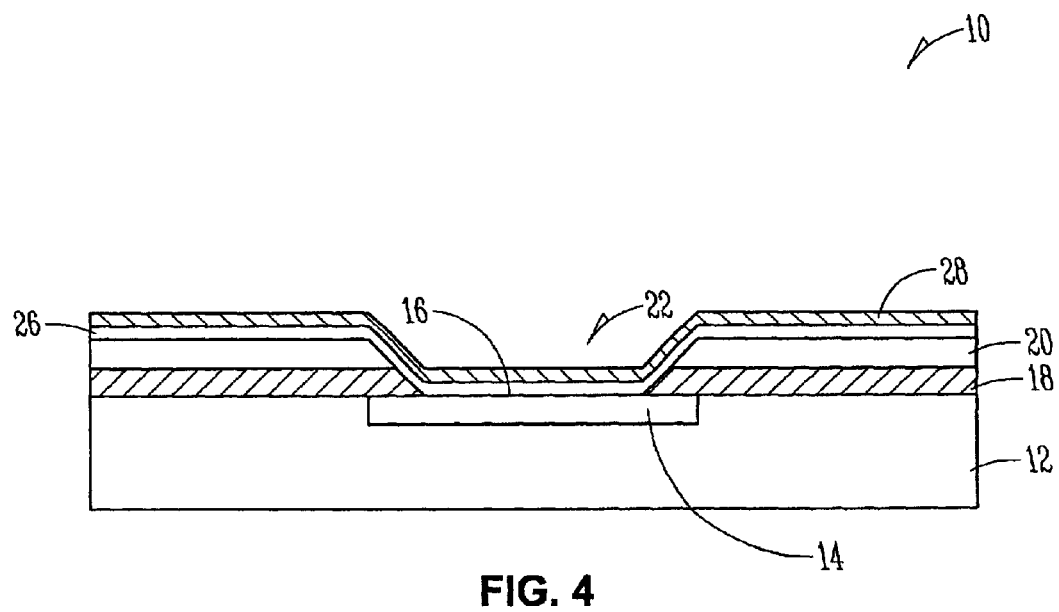
FIG. 4 is an elevational cross-section of the semiconductor structure depicted in FIG. 3 after further processing.

FIG. 4 illustrates further processing in which metal first layer 26 is covered with a metal second layer 28. Metal second layer 28 is formed by PVD according to known technique. In one embodiment, metal second layer 28 is sputtered copper and is sputtered under conditions to impart a compressive stress therein. Such conditions are known in the art. Metal second layer 28 may have a thickness in a range from about 1,000 Å to about 5,000 Å, preferably from about 1,500 Å to about 4,000 Å, and more preferably about 2,000 Å.

Figure 5:
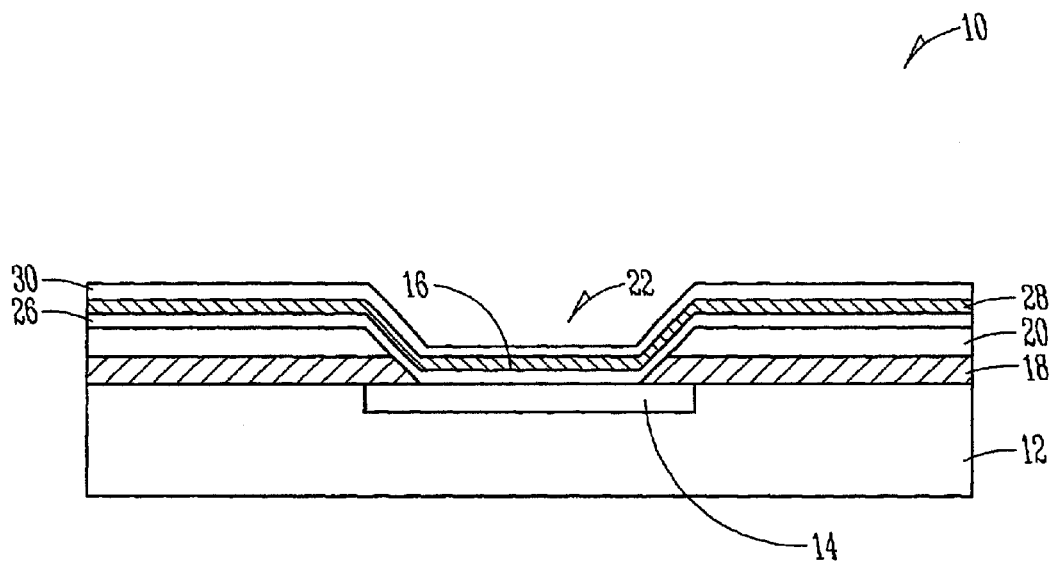
FIG. 5 is an elevational cross-section of the semiconductor structure depicted in FIG. 4 after further processing.

In this embodiment, where metal second layer 28 is sputtered copper, a metal third layer 30 comprises a refractory metal that is also sputter deposited. FIG. 5 illustrates further processing in which a metal third layer 30 is formed over the sputtered copper of metal second layer 28. Metal third layer 30 may preferably be a refractory metal, a refractory metal alloy, or a doped refractory metal. The refractory metal alloy or the doped metal may be in stoichiometric or solid solution ratios. In one embodiment, metal third layer 30 is a vanadium-alloyed or vanadium-doped metal of at least one metal selected from nickel, cobalt, palladium, platinum, and the like. The vanadium may be added where the refractory metal may be ferroelectric. In one embodiment, metal third layer 30 is a metal, a vanadium-alloyed, or vanadium-doped metal of at least one selected from titanium, zirconium, hafnium, and the like. In another embodiment, metal third layer 30 is a metal, a vanadium-alloyed, or vanadium-doped metal of at least one selected from chromium, molybdenum, tungsten, and the like. In another embodiment, metal third layer 30 is a metal, a vanadium-alloyed, or vanadium-doped metal of at least one selected from scandium, yttrium, lanthanum, cerium, and the like.

In one embodiment, metal third layer 30 is a refractory metal, a refractory metal-vanadium alloy, or vanadium-doped metal that is formed by PVD to a thickness in a range from about 1,000 Å to about 5,000 Å, preferably from about 1,500 Å to about 4,000 Å, and more preferably about 2,000 Å. In one embodiment, metal third layer 30 is a NiV alloy. In another embodiment, metal third layer 30 is a vanadium-doped nickel layer.

Although sputtering of the three metal layers 26–30 may be an embodiment, evaporation deposition of compositions such as an organometallic materials may also be used as is known in the art.

In an alternative embodiment, metal third layer 30, is nitrided to form a nitrided metal alloy or a nitrided vanadium-doped metal as set forth herein. Nitriding conditions may be carried out according to known technique for nitridation of metals. In selected embodiments, metal third layer 30 is a nitrided refractory metal-vanadium alloy or a nitrided, vanadium-doped refractory metal. In other selected embodiments, metal third layer 30 is a nitrided NiV alloy or a nitrided vanadium-doped nickel metal.

In a second general embodiment, metal first layer 26 is titanium (Ti) that is formed by PVD as set forth herein. Metal third layer 30 comprises copper that is sputtered according to conditions as set forth herein. Metal third layer 30 is formed by PVD according to known technique. In one embodiment, metal third layer 30 is sputtered copper and is sputtered under conditions to impart a compressive stress therein. Such conditions are known in the art. Metal third layer 30 may have a thickness in a range from about 1,000 Å to about 5,000 Å, preferably from about 1,500 Å to about 4,000 Å, and more preferably about 2,000 Å.

In this embodiment, where metal third layer 30 is sputtered copper, the metal second layer 28 comprises a refractory metal that is also sputter deposited. Accordingly, where metal third layer 30 is sputtered copper, metal second layer 28 is a refractory metal. As set forth in the first general embodiment, metal second layer 28 is processed under conditions that are similar or equivalent to the formation of metal third layer 30 where metal second layer 28 is sputtered copper. Metal second layer 28 may preferably be a NiV alloy or V-doped Ni metal as set forth herein. Further, metal second layer 28 may preferably be a nitrided NiV composition as set forth herein.

Similarly, although sputtering of the three metal layers 26–30 may be an embodiment where metal third layer 30 is copper, evaporation deposition of compositions such as an organometallic materials may also be used as is known in the art.

According to the first and second general embodiments, following the formation of the three metal layers 26–30 as set forth herein, processing may continue by plating a bump precursor over the three-metal-layer stack. Plating may be electroless plating or preferably electroplating as is known in the art.

Figure 6:
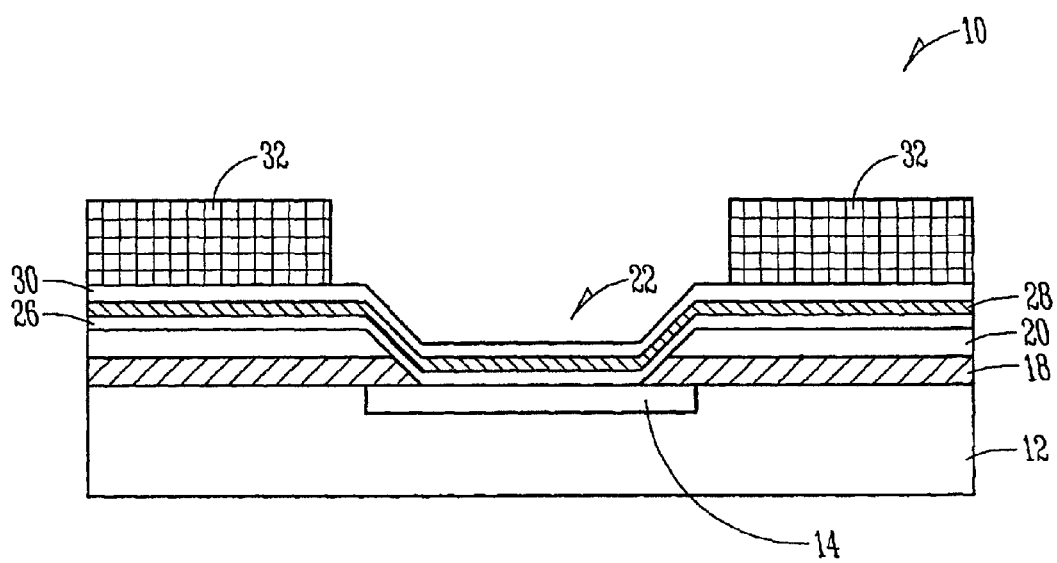
FIG. 6 is an elevational cross-section of the semiconductor structure depicted in FIG. 5 after further processing.

FIG. 6 illustrates further processing in which a second mask 32 is patterned to expose metal third layer 30 where the exposure is substantially centered over metallization 14. Second mask 32 is peripherally patterned because a plating process is carried out to plate a bump precursor that adheres to metal third layer 30.

Figure 7:
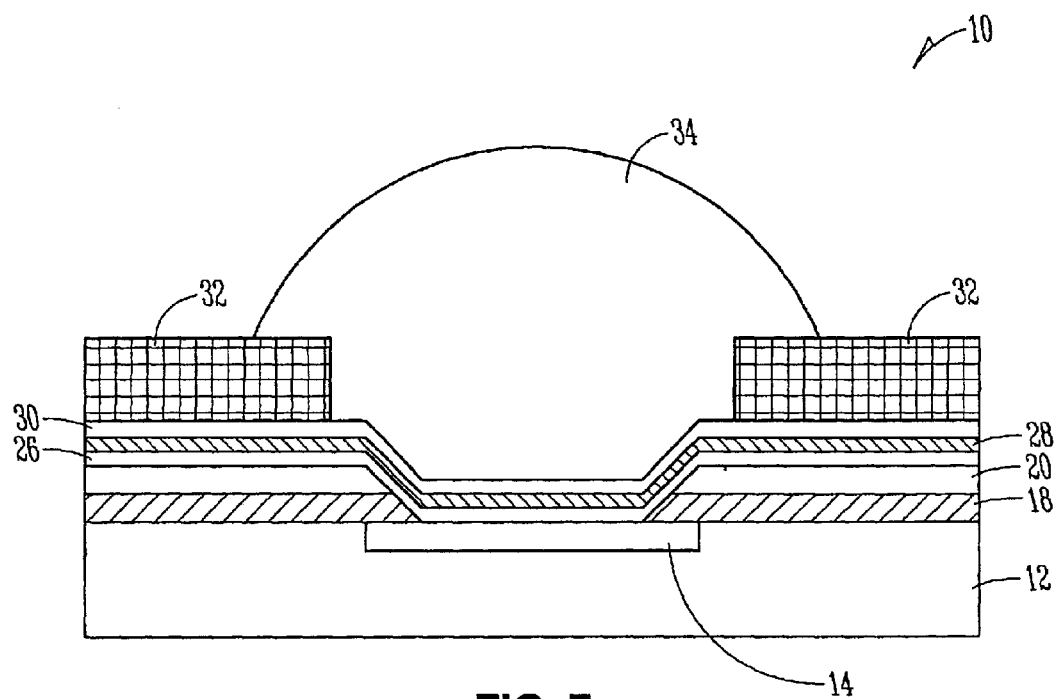
FIG. 7 is an elevational cross-section of the semiconductor structure depicted in FIG. 6 after further processing.

FIG. 7 illustrates further processing in which a bump precursor button 34 has been plated over metal third layer 30 through second mask 32. Plating may be carried out by electroless plating techniques or by electroplating techniques as is known in the art. Preferably, by way of non-limiting example, electroplating is carried out to form bump precursor button 34 as a discrete structure that is spaced-apart from any closest neighboring bump precursors. Accordingly, bump precursor button 34 may have a curvilinear perimeter (not pictured) and a curvilinear vertical profile. Alternatively, a plating film may be blanket formed and subsequently patterned into substantially discrete bump precursor structures by a process such as an etch. Accordingly, the patterned bump precursor structure may have a rectilinear perimeter (not pictured) and a rectilinear vertical profile (also not pictured). In any event, bump precursor button 34 or a patterned bump precursor structure (not depicted) may be selected from a solder composition that facilitates embodiments.

Bump precursor button 34 may be a tin-lead solder. In selected embodiments, bump precursor button 34 is a tin-lead solder composition such as Sn97Pb. A tin-lead solder composition that may be used with a substrate that is to be flip-chip mounted over semiconductor structure 10 is a Sn37Pb composition. In any event, bump precursor button 34 may be a tin-lead solder comprising $Sn_xPb_y$, wherein x+y total 1, and wherein x is in a range from about 0.3 to about 0.99. Preferably, the bump precursor button 34 is a tin-lead solder composition of Sn97Pb, and substrate solder for forming the flip-chip bond is a tin-lead solder composition of Sn37Pb.

Figure 8:
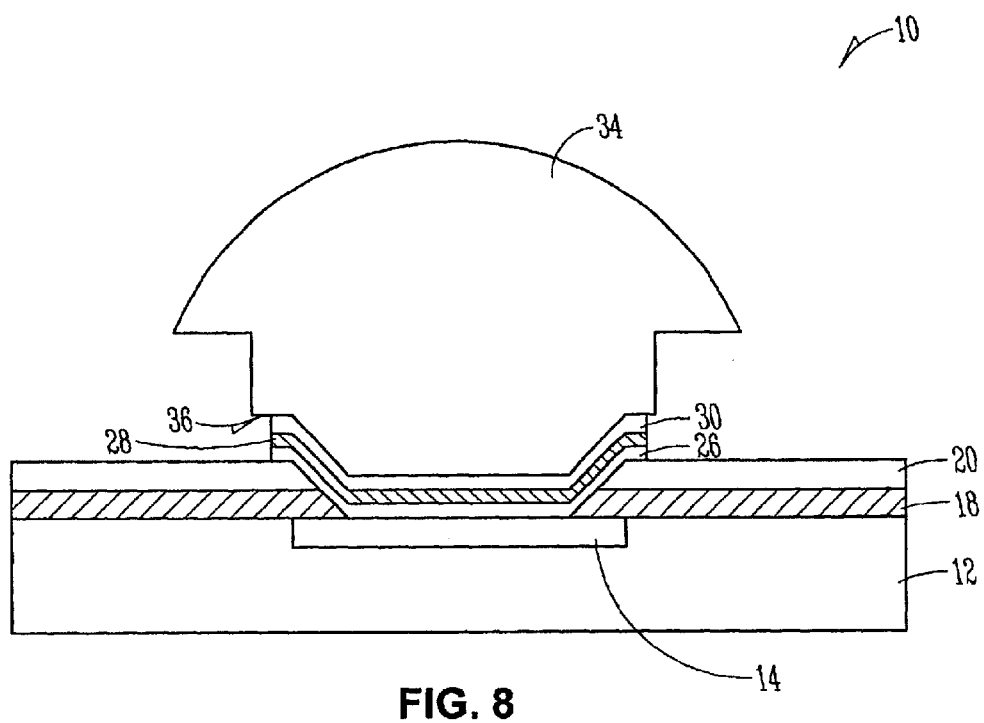
FIG. 8 is an elevational cross-section of the semiconductor structure depicted in FIG. 7 after further processing.

FIG. 8 illustrates further processing in which the three metal layers 28–30 are removed substantially everywhere except directly under bump precursor button 34. Second mask 32 may be simultaneously removed, or it may be preliminarily or subsequently removed such as by wet stripping or by ashing. Removal of lateral portions of the three metal layers 26–30 may be carried out by a wet etch that is substantially selective to the electrically conductive bump precursor button 34, and to patterned passivation layer 20 and patterned nitride layer 18. Although some undercutting 36 into the three metal layers 26–30 beneath bump precursor button 34 may be desirable, it may be balanced against risking a total slumping of the solder during reflow. In one embodiment, undercutting 36 may be in a range from about 0.5 micrometers (microns) to about 6 microns, preferably about 3 microns.

Figure 9:
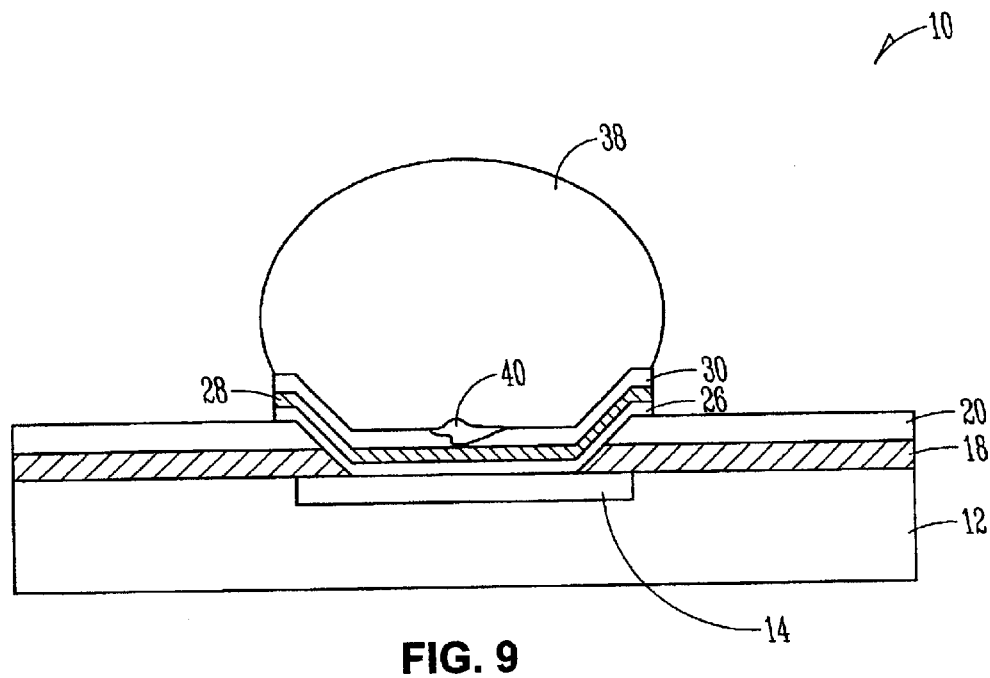
FIG. 9 is an elevational cross-section of the semiconductor structure depicted in FIG. 8 after further processing.

FIG. 9 illustrates further processing in which the bump precursor button 34 has been reflowed into a solder ball 38 that has been dimensionally limited by the metallurgy of the metal layers 26–30 and by the degree of undercutting as set forth herein. Hence the BLM of an embodiment may cause sufficient wetting of solder ball 38 onto metal third layer 30 to form a solder ball 38 that has a preferred shape and height. In selected embodiments, the vertically measured diameter of solder ball 38 may be in a range from about 50 microns to about 200 microns. In another embodiment, the major vertical dimension of bump precursor button 34 is about 57 microns before it is reflowed, and it is about 100 microns after it is reflowed.

The eccentricity (the vertical diameter divided by the horizontal diameter) of solder ball 38 may be in a range from about 0.5 to about 1.2. A lower eccentricity may be preferred where the pitch of a given ball array would lead to a bridging problem between neighboring balls during reflow or during reflow flip-chip mounting. Eccentricity may be controlled by solder ball amount and solder ball wetting properties in relation to metal third layer 30.

Because some intermetallic material may form between the solder ball 38 and metallization 14, the metal layers 26–30 act to prevent excessive intermetallic formation, and to resist tin migration toward metallization 14. FIG. 9 illustrates an intermetallic zone 40, in an arbitrary shape and size, that may form under ordinary processing conditions according to an embodiment. Where the metallurgy of solder ball 38 is $Sn_xPb_y$, or the like, a nickel-tin intermetallic zone 40 may form that may be restricted by the BLM configuration according to embodiments set forth herein.

As set forth herein, certain thicknesses of the metal layers 26–30 are preferred to control formation of intermetallic material. The metal layers should not be too thin individually so that the BLM stack is consumed. Otherwise, during the temperature cycling, once the BLM stack is consumed, the intermetallic that forms, segregates and forms shapes that may move upward into the solder. Consequently, volume changes that correspond with notable amounts of intermetallic formation may cause significant stress in the electrical structure. In various embodiments, the copper absorbs and combines with significant amounts of tin that migrates from the solder ball 38. Consequently, significant consumption of migrating tin into the copper layer is accomplished, whether it is metal second layer 28 or metal third layer 30.

Figure 10:
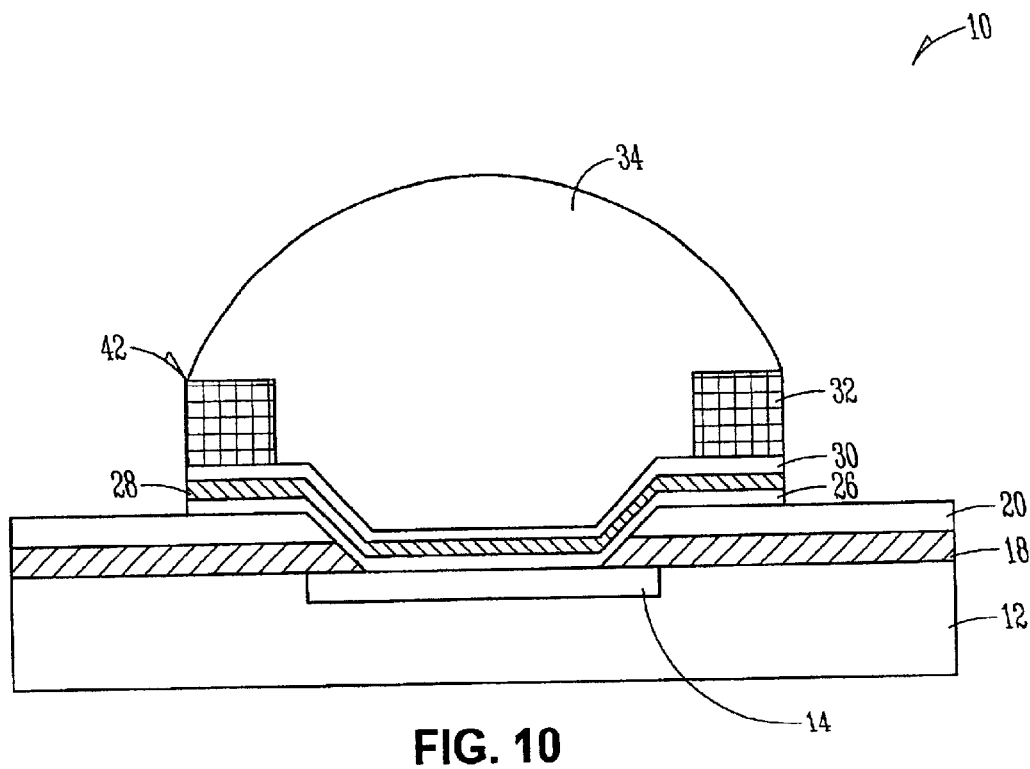
FIG. 10 is an elevational cross-section of the semiconductor structure depicted in FIG. 7 after further processing according to an alternative process flow.

Processing of undercut 36 may be controlled by specific etch conditions for removal of the metal layers 26–30. For example, second mask 32 may be removed by any means such as wet stripping or ashing, and a multi-process etch may be carried out to remove lateral portions of the three metal layers 26–30 as depicted in FIG. 10. In a first process, an anisotropic etch is carried out where bump precursor button 34, out to the tip 42 thereof, acts as a shadow mask. FIG. 10 illustrates shadow mask etching wherein second mask 32 is removed except where it is shadow-protected by tip 42 of bump precursor button 34. Similarly, removal of the metal layers 28–30 has occurred, preferably by a second etch, except where bump precursor button 34 acts as a shadow mask. Next, second mask 32 is wet stripped. Thereafter, a wet etch is carried out to remove excess metal layer material to achieve a structure similar to what is depicted in FIG. 8. Alternatively, the wet etch recipe may be configured to simultaneously remove second mask 32.

Figure 11:
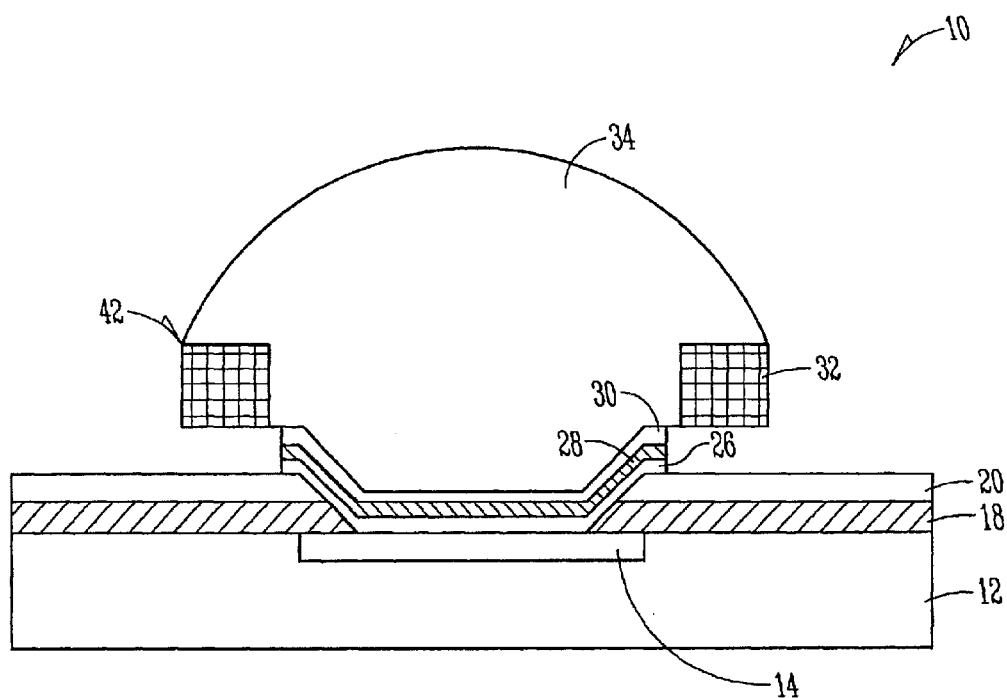
FIG. 11 is an elevational cross-section of the semiconductor structure depicted in FIG. 10 after further processing.

In a third alternative, processing is carried out similar to what is depicted as being processed in FIG. 11. After the anisotropic etch process or processes of some of second mask 32 and some of the metal layers 26–30 is completed as depicted in FIG. 10, an isotropic wet etch is carried out. The isotropic wet etch laterally etches the metal layers 26–30 to form metal layers 26–30 similar to what is depicted in FIG. 8. The etch recipe is selective to various structures including passivation layer 24, what is left of second mask 32 by the shadow-mask effect of bump precursor button 34, and bump precursor button 34 itself. Thereafter, wet stripping, ashing, or another removal technique known in the art is carried out to remove what is left of second mask 32. Thereby, undercutting 36 (FIG. 8) of the metal layers 26–30 is controlled by the presence of what is left of second mask 32 and excessive or disproportional undercutting into refractory metal upper layer 30 is resisted.

The following is a first process example that relates to semiconductor structure 10 as depicted in FIGS. 1–11. A substrate 12 containing an M6 metallization and a metallization 14 bond pad is provided. Substrate 12 contains a silicon oxide ILD material as is known in the art. A nitride layer 18 and a passivation layer 20 are formed over substrate 12 and metallization 14. Passivation layer 20 is a polyimide layer that is formed according to known technique and that cures with an angle 24 that is about 45°. Thereafter, a photoresist first mask (not pictured) is spun on, cured, exposed, and patterned to form a recess 22. Etching of passivation layer 20 and nitride layer 18 is carried out in a dry etch that exposes metallization 14.

A metal first layer 26 is formed by PVD of Ti over substrate 12 and structures supported thereon. Metal first layer 26 is about 2,000 Å. Next, a copper metal second layer 28 is formed by PVD over metal first layer 26. Copper metal second layer 28 is about 2,000 Å. A metal third layer 30 is formed by PVD of a NiV alloy over copper metal second layer 28. Metal third layer 30 is about 2,000 Å. Nitriding of metal third layer 30 is carried under thermal processing conditions.

After the formation of the three metal layers 26–30, a photoresist second mask 32 is spun on, cured, exposed, and patterned according to known technique. Patterning of second mask 32 exposes metal third layer 30 directly above metallization 14. Thereafter, an electroplating solution that has tin and lead in a Sn97Pb proportion is applied over substrate 12 until a bump precursor button 34 has been formed. Next, an anisotropic etch is carried out by the shadow mask technique that removes portions of second mask 32 and that stops on refractory metal upper metal layer 30. A follow-up anisotropic etch is carried out that removes lateral portions of the three metal layers according to the shadow-mask technique set forth herein. Finally, a wet third etch is carried out that undercuts 36 the remaining portions of second mask 32 until a preferred dimension of a BLM stack of the three metal layers 26–30 remains. Second mask 32 is removed by a wet stripping process. Thereafter, a thermal process acts that reflows bump precursor button 34 to form a solder ball 38.

The following is a second process example that relates to semiconductor structure 10 as depicted in FIGS. 1–11. In this process example, the same processing is carried out as in the first process example, with the alteration that metal second layer 28 is a NiV composition as set forth herein that is sputtered and nitrided. Thereafter, metal second layer 28 and covered with a copper metal third layer 30 by sputtering copper.

Figure 12:
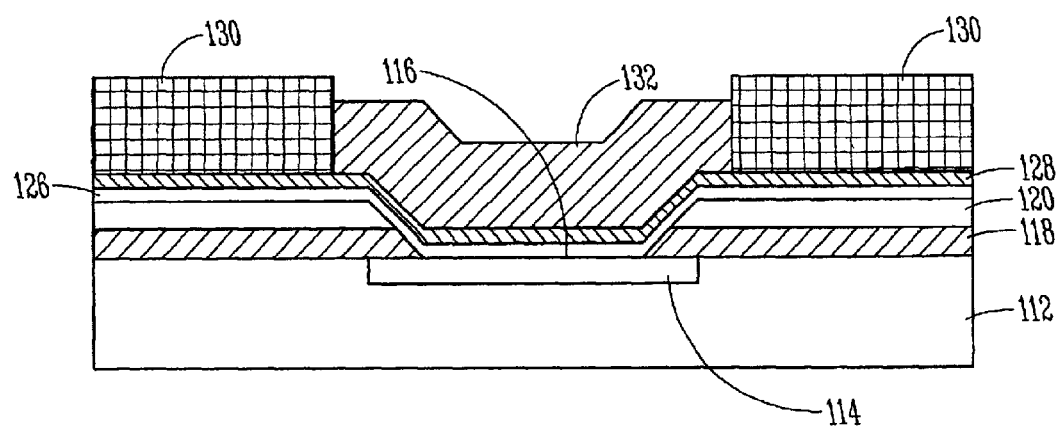
FIG. 12 is an elevational cross-section of an alternative semiconductor structure embodiment.

FIG. 12 represents processing of a third general embodiment of the present invention. Similar to fabrication of semiconductor structure 10 depicted in FIGS. 1–9, a semiconductor structure 110 is formed where the metal third layer comprises a copper stud.

Semiconductor structure 110 includes a substrate 112 and a metallization 114 such as a copper pad that makes connection to an M6 by way of non-limiting example. Metallization 114 may be disposed upon an upper surface 116 of substrate 112 where substrate 112 may be an interlayer dielectric (ILD) composition. A patterned passivation layer 120 and a patterned nitride layer 118 are formed over substrate 112 and metallization 114. A metal first layer 126 is disposed over patterned passivation layer 124 and metallization 114. Metal first layer 126 may be a refractory metal such as titanium, zirconium, hafnium, and the like. Other refractory metals for metal first layer 126 may include nickel, cobalt, palladium, platinum, and the like. Other refractory metals for metal first layer 126 may include chromium, molybdenum, tungsten, and the like. Other refractory metals for metal first layer 126 may include scandium, yttrium, lanthanum, cerium, and the like. One preferred property embodiment may be a metal first layer that exhibits sufficient adhesion to the metallization that liftoff or spalling thereof will not occur during fabrication, test, and ordinary field use. Such examples are Cr, TiW, and W.

In one embodiment, metal first layer 126 is Ti that is formed by PVD to a thickness in a range from about 500 Å to about 4,000 Å, and preferably about 2,000 Å. In another embodiment, metal first layer 126 is Cr that is formed by PVD to a thickness in a range from about 500 Å to about 4,000 Å, and preferably about 2,000 Å. In another embodiment, metal first layer 126 is W that is formed by PVD to a thickness in a range from about 500 Å to about 4,000 Å, and preferably about 2,000 Å. In another embodiment, metal first layer 126 is TiW that is formed by PVD to a thickness in a range from about 500 Å to about 4,000 Å, and preferably about 2,000 Å.

Metal first layer 126 is covered with a copper metal second layer 128. Copper metal second layer 128 is formed by PVD according to known technique that imparts a compressive stress therein. Copper metal second layer 128 may have a thickness in a range from about 500 Å to about 4,000 Å, preferably about 2,000 Å. Although sputtering of the metal layers 126 and 128 may be a preferred embodiment, evaporation deposition of a compositions such as organometallic materials may also be used as is known in the art.

After the formation of copper metal second layer 128, a second mask 130 is formed from a photoresist that is spun on, cured, exposed, and patterned. Thereafter, a copper stud 132 is formed in the patterning of second mask 130 in order to make contact with copper second layer 128. Copper stud 132 may be formed by electroplating or by electroless plating according to known technique. Preferably, copper stud 132 has a thickness in a range from about 5 microns to about 15 microns, and more preferably about 10 microns. Under certain applications, a 10-micron thick copper stud 132 may provide sufficient excess copper to absorb migrating tin from either the solder ball of semiconductor structure 110 that will be formed, or from solder ball of a flip chip. One preferred metal stack comprises metal first layer 126 of Ti at about 2,000 Å, copper metal second layer 128 of Cu at about 2,000 Å, and copper stud 132 of Cu at about 10 microns.

Figure 13:
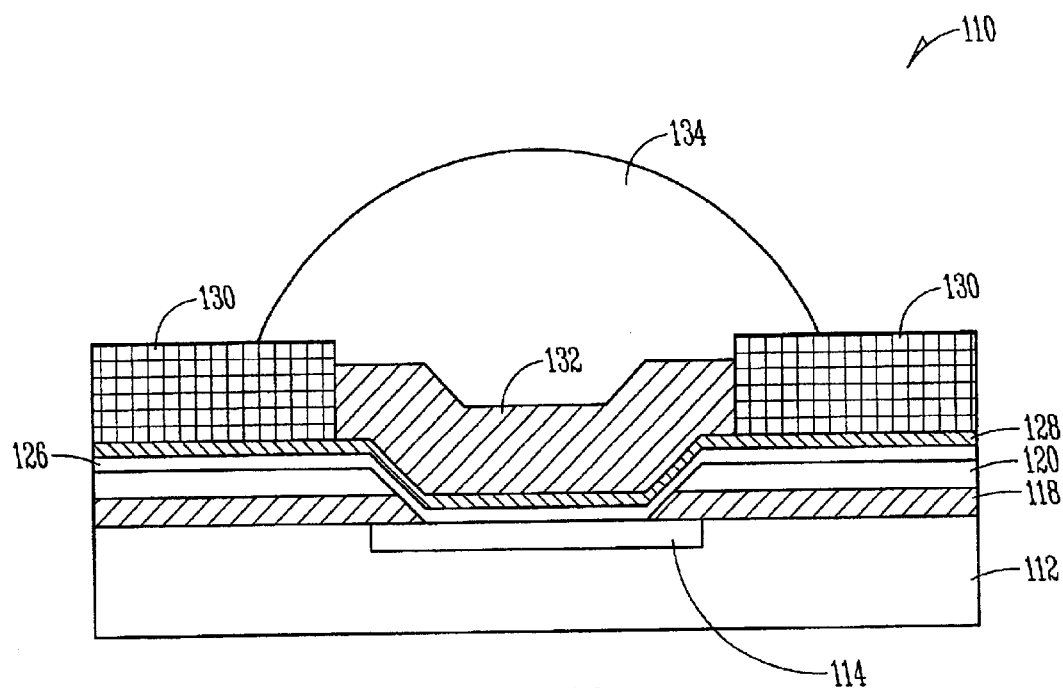
FIG. 13 is an elevational cross-section of the semiconductor structure depicted in FIG. 12 after further processing.

Following the formation of the metal layers 126–132 as set forth herein, processing may continue by plating a bump precursor over the three-metal-layer stack similar to semiconductor structure 10 depicted in FIGS. 6–11 according to various process flow embodiments. FIG. 13 illustrates further processing in which a bump precursor button has been plated over copper stud 132 through second mask 130. Plating may be carried out by electroless plating techniques or by electroplating techniques as is known in the art. Preferably, by way of non-limiting example, electroplating is carried out to form bump precursor button 134 as a discrete structure that is spaced-apart from any closest neighboring bump precursors. Accordingly, bump precursor button 134 may have a curvilinear perimeter (not pictured) and a curvilinear vertical profile. Alternatively, a plating film may be blanket formed and subsequently patterned into substantially discrete bump precursor structures by a process such as an etch. Accordingly, the patterned bump precursor structure may have a rectilinear perimeter (not pictured) and a rectilinear vertical profile (also not pictured). In any event, bump precursor button 134 or a patterned bump precursor structure (not depicted) may be selected from a solder composition that facilitates embodiments.

Bump precursor button 134 may be a tin-lead solder. In selected embodiments, bump precursor button 134 is a tin-lead solder composition such as Sn97Pb. A tin-lead solder composition that may be used with a substrate that is to be flip-chip mounted over semiconductor structure 10 is a Sn37Pb composition. In any event, bump precursor button 134 may be a tin-lead solder comprising $Sn_xPb_y$, wherein x+y total 1, and wherein x is in a range from about 0.3 to about 0.99. Preferably, the bump precursor button 134 is a tin-lead solder composition of Sn97Pb, and substrate solder for forming the flip-chip bond is a tin-lead solder composition of Sn37Pb. Copper stud 132 acts as a significant tin absorber, particularly for Sn37Pb from a flip-chip solder that will mingle with the solder ball of semiconductor structure 110.

Figure 14:
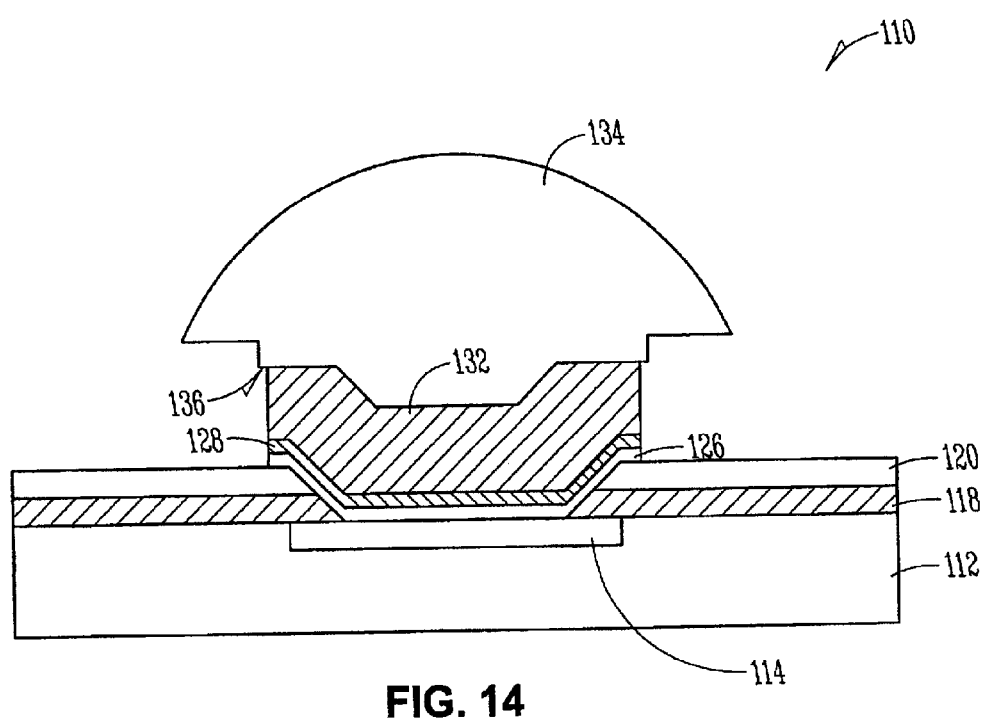
FIG. 14 is an elevational cross-section of the semiconductor structure depicted in FIG. 13 after further processing.

FIG. 14 illustrates further processing in which the metal layers 126 and 128 are removed substantially everywhere except directly under bump precursor button 134. Second mask 130 may be simultaneously removed, or it may be preliminarily or subsequently removed such as by wet stripping or by ashing. Removal of lateral portions of the metal layers 126 and 128 may be carried out by a wet etch that is substantially selective to the electrically conductive bump precursor button 134, and to the patterned passivation layer 120 and the patterned nitride layer 118. Although some undercutting 136 into the metal layers 126 and 128 and into copper stud 132 beneath bump precursor button 34 may be desirable, it may be balanced against risking a total slumping of the solder during reflow. In one embodiment, undercutting 136 may be in a range from about 0.5 microns to about 6 microns, preferably about 3 microns.

Figure 15:
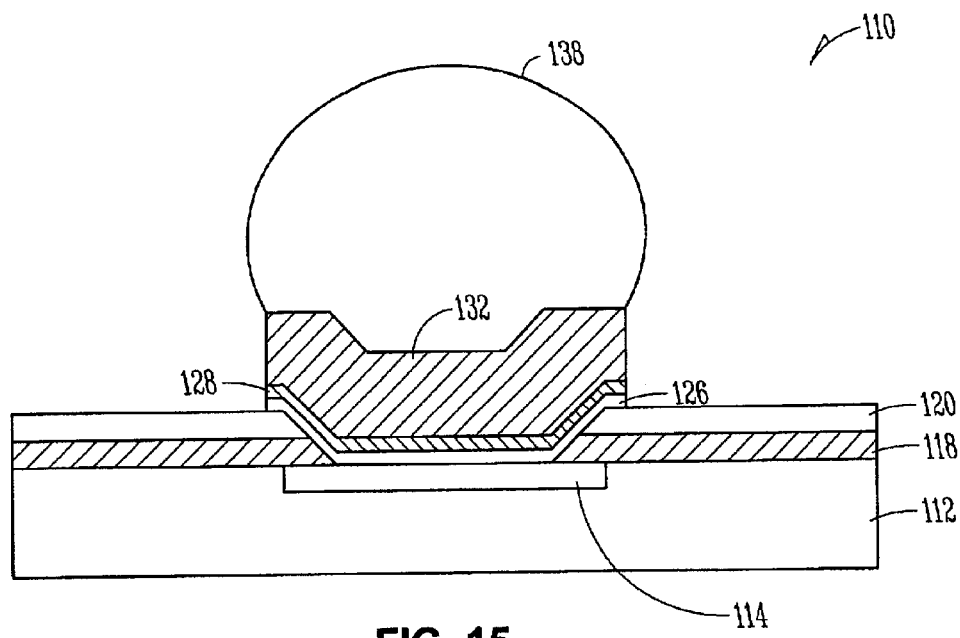
FIG. 15 is an elevational cross-section of the semiconductor structure depicted in FIG. 14 after further processing.

FIG. 15 illustrates further processing in which the bump precursor button 134 has been reflowed into a solder ball 138 that has been dimensionally limited by the metallurgy of the metal layers 126 and 128 and by the degree of undercutting as set forth herein. Hence the BLM of an embodiment may cause sufficient wetting of solder ball 138 over copper stud 132 to form a solder ball 138 that has a preferred shape and height. In selected embodiments, the vertically measured diameter of solder ball 138 may be in a range from about 50 microns to about 200 microns. In another embodiment, the major vertical dimension of bump precursor button 34 is about 60 microns before it is reflowed, and it is about 100 microns after it is reflowed.

The eccentricity of solder ball 138 may be in a range from about 0.5 to about 1.2. A lower eccentricity may be preferred where the pitch of a given ball array would lead to a bridging problem between neighboring balls during reflow or during reflow flip-chip mounting. Eccentricity may be controlled by solder ball amount and solder ball wetting properties in relation to copper metal second layer 128 and copper stud 132.

Figure 16:
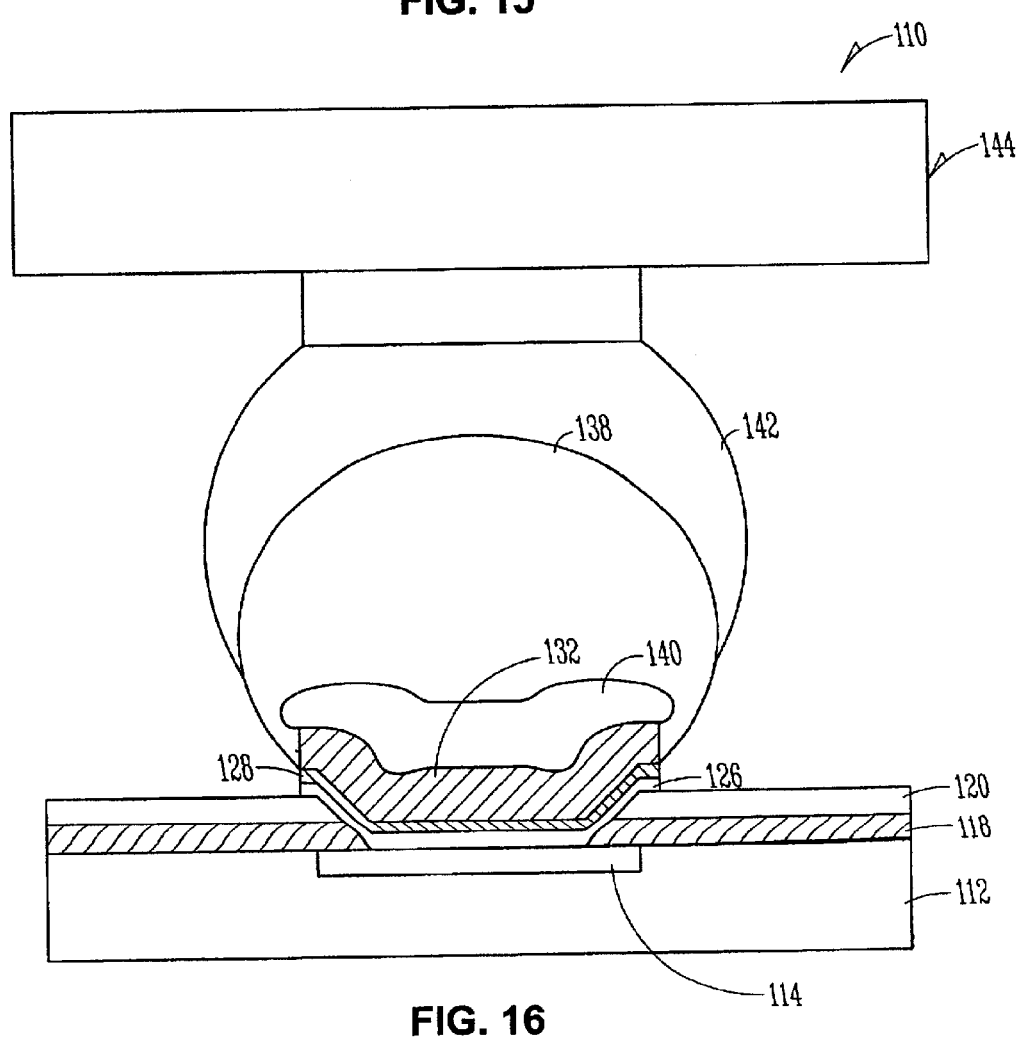
FIG. 16 is an elevational cross-section of the semiconductor structure depicted in FIG. 13 after further processing.

Because some intermetallic material may form between the solder ball 138 and metallization 114, the metal layers 126, 128 and 132 act to prevent excessive intermetallic formation or to resist tin migration toward metallization 114. FIG. 16 illustrates an intermetallic zone 140, in an arbitrary shape and size, that may form under ordinary processing conditions according to an embodiment. A Sn37Pb solder ball 142 from a flip chip 144 is depicted as having collapsed over solder ball 138 and significant tin migration from both solder balls 138 and 142 has acted with copper stud 132 to form intermetallic zone 140.

With the presence of copper stud 132, eventually, intermetallic zone 140 may grow to a size and shape that acts as a barrier to further tin migration. In other words, intermetallic zone 140 substantially isolates copper stud 132 from solder ball 138. More generally, an intermetallic zone may form, whether it is in semiconductor structure 10 or semiconductor structure 110, to substantially isolate migrating tin in a solder ball from the metallization such as a copper pad or a level such as M6. Where the metallurgy of solder ball 138 is $Sn_xPb_y$ or the like, a copper-tin intermetallic zone 140 may form that may be restricted by the BLM configuration according to embodiments set forth herein.

The combination of semiconductor structure 110 and flip chip 144 may constitute a system according to an embodiment. The system may comprise any electrical device that employs flip-chip technology. Similarly, the semiconductor structure 10 depicted in FIG. 9 may also be part of a system. Where either of semiconductor structures 10 or 110 comprise an electrical device, it may comprises a chip-scale package. In another embodiment, the flip chip 144 may comprise a chip-scale package. In yet another embodiment, both the electrical device and the flip chip comprise chip-scale packages. In one embodiment, the flip-chip 144 comprises a solder ball 142 having a composition of about Sn37Pb, and the electrically conductive bump that may be either solder ball 38 or 138 may comprise a solder having a composition of about Sn97Pb.

The following is an example of a process flow embodiment for the third general embodiment. Reference may be made to FIGS. 12–16. A substrate 112 containing an M6 metallization and a metallization 114 bond pad is provided. Substrate 112 contains a silicon oxide ILD material as is known in the art. A patterned passivation layer 120 and a patterned nitride layer 118 are formed over substrate 112 and metallization 114. Patterned passivation layer 120 and patterned nitride layer 118 layer are formed according to known technique and as set forth herein.

A metal first layer 126 is formed by PVD of Ti over substrate 112 and structures supported thereon. Metal first layer 126 is about 2,000 Å thick and is under a compressive stress. Next, a copper metal second layer 128 is formed by PVD over metal first layer 126. Copper metal second layer 128 is sputtered under conditions to impart a compressive stress therein. Copper metal second layer 128 is about 2,000 Å thick. A second mask 130 is formed from photoresist material that is spun on, cured, exposed, and patterned. Thereafter, a copper stud 132 is electroplated to a thickness of about 10 microns.

After the formation of the three metal layers 126, 128 and 132, an electroplating solution that has tin and lead in a Sn97Pb proportion is applied over substrate 112 to form a bump precursor button 134. Etching is carried out similar to the first and second general embodiment examples to achieve an undercut 136 of about 3 microns. Thereafter, bump precursor button 134 is reflowed to form a solder ball 138. Flip-chip processing is then carried out in which a flip chip 144 is imposed over semiconductor structure 110 and the solder ball 142 of flip-chip 144, comprising Sn37Pb, is reflowed over solder ball 138. Under these and subsequent processing and test conditions, an intermetallic zone 140 forms out of tin and copper that substantially halts tin migration toward metallization 114.

Figure 17:
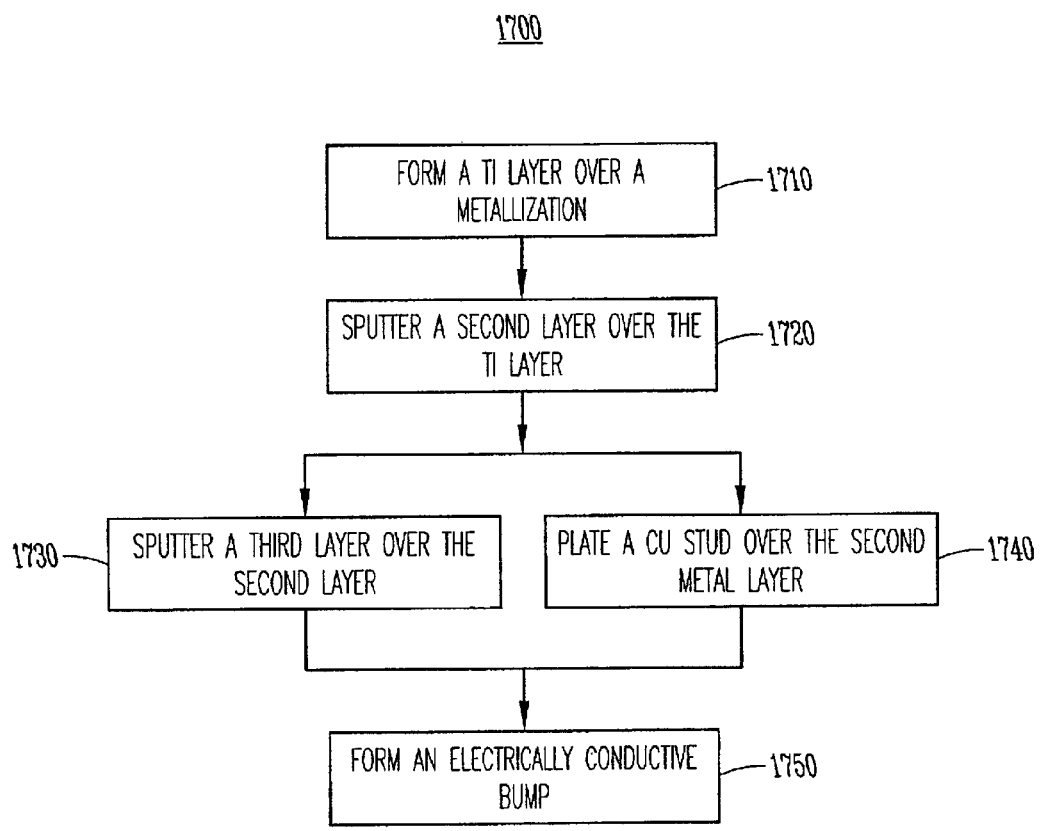
FIG. 17 is a chart that describes a process flow embodiment.

FIG. 17 is a process flow diagram of an embodiment. The process 1700 includes forming 1710 a metal first layer over a metallization as set forth herein. Processing continues by forming 1720 a metal second layer over the metal first layer. According to one embodiment, a metal third layer is formed 1730 over the metal second layer. Where metal second layer is copper, metal third layer is a refractory metal layer. Contrariwise, where metal second layer is a refractory metal, metal third layer is copper. According to another embodiment, a copper stud is plated 1740 over metal second layer. In this embodiment, metal second layer is also copper that is sputtered. Finally, an electrically conductive bump is formed 1750 as set forth herein. Additionally, a flip chip may be bonded to the electrically conductive bump.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A ball-limiting metallurgy (BLM) stack comprising:
   a metal adhesion first layer disposed above and on a metallization;
   a metal second layer disposed above and on the metal adhesion first layer;
   a metal third layer disposed above and on the metal second layer;
   an electrically conductive bump disposed above and on the metal third layer; and
   wherein the metal second layer comprises a copper layer and wherein the metal third layer comprises a copper stud.

2. The BLM stack according to claim 1, wherein the metal adhesion first layer is selected from Ti, TiW, W, and Cr.

3. The BLM stack according to claim 1, further comprising:
   an intermetallic layer disposed between the metallization and the electrically conductive bump.

4. The BLM stack according to claim 1, wherein the electrically conductive bump comprises a tin-lead solder composition selected from Sn37Pb, Sn97Pb, and $Sn_xPb_y$, wherein x+y total 1 and wherein x is in a range from about 0.3 to about 0.99.

5. The BLM stack according to claim 1, wherein the metal adhesion first layer includes a Ti composition, wherein the Ti composition has a thickness in a range from about 500 Å to about 4,000 Å.

6. The BLM stack according to claim 1, wherein the metal third layer includes a copper stud over the metal second layer, wherein the copper stud has a thickness in a range from about 5 micrometers to about 15 micrometers.

7. The BLM stack according to claim 1, wherein the metal third layer includes a copper stud over the metal second layer, wherein the copper stud has a thickness in a range from about 5 micrometers to about 15 micrometers, and wherein the metal second layer has a thickness in a range from about 1,000 Å to about 5,000 Å.

* * * * *